US009734008B2

(12) United States Patent
Healy et al.

(10) Patent No.: US 9,734,008 B2
(45) Date of Patent: *Aug. 15, 2017

(54) ERROR VECTOR READOUT FROM A MEMORY DEVICE

(71) Applicant: International Business Machines Corporation, Armonk, NY (US)

(72) Inventors: Michael B. Healy, White Plains, NY (US); Hillery C. Hunter, Chappaqua, NY (US); Charles A. Kilmer, Essex Junction, VT (US); Kyu-hyoun Kim, Chappaqua, NY (US); Warren E. Maule, Cedar Park, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 93 days.

This patent is subject to a terminal disclaimer.

(21) Appl. No.: 14/724,901

(22) Filed: May 29, 2015

(65) Prior Publication Data

US 2016/0328285 A1 Nov. 10, 2016

Related U.S. Application Data

(63) Continuation of application No. 14/705,115, filed on May 6, 2015.

(51) Int. Cl.
*G06F 11/10* (2006.01)
*G06F 11/08* (2006.01)
(Continued)

(52) U.S. Cl.
CPC .......... *G06F 11/1008* (2013.01); *G06F 3/064* (2013.01); *G06F 3/0619* (2013.01);
(Continued)

(58) Field of Classification Search
CPC .. G06F 11/1008; G06F 11/08; G06F 11/1076; G06F 11/1072; G06F 11/106;
(Continued)

(56) References Cited

U.S. PATENT DOCUMENTS 6,351,412 B1* 2/2002 Nozoe ................ G06F 11/1068
365/185.09
7,996,734 B2* 8/2011 Earle .................. G06F 11/1048
714/718
(Continued)

OTHER PUBLICATIONS

Chishti et al., Improving Cache Lifetime Reliability at Ultra-low Voltages, Jan. 2009, ACM, pp. 1-12.*
(Continued)

*Primary Examiner* — John J Tabone, Jr.
(74) *Attorney, Agent, or Firm* — Cantor Colburn LLP

(57) ABSTRACT

A memory management system and method of managing output data resulting from a memory device storing raw data and error correction coding (ECC) bits are described. The system includes a controller to receive a read command and control a memory device based on the read command, the memory device to store raw data and error correction coding (ECC) bits and output the raw data and the ECC bits corresponding with memory addresses specified in the read command, and an ECC decoder to output an error vector associated with the memory addresses based on the raw data and the ECC bits corresponding with the memory addresses output by the memory device, the error vector associated with the memory addresses indicating errors in the raw data corresponding with the memory addresses. The system also includes a multiplexer (MUX) to output the error vector based on a selection indicated in the read command.

6 Claims, 14 Drawing Sheets

(51) Int. Cl.
*G06F 3/06* (2006.01)
*G11C 29/52* (2006.01)
*G11C 7/10* (2006.01)
*G11C 29/04* (2006.01)

(52) U.S. Cl.
CPC ............ *G06F 3/0673* (2013.01); *G06F 11/08* (2013.01); *G06F 11/106* (2013.01); *G06F 11/1032* (2013.01); *G06F 11/1072* (2013.01); *G06F 11/1076* (2013.01); *G11C 7/1006* (2013.01); *G11C 7/1051* (2013.01); *G11C 29/52* (2013.01); *G11C 2029/0411* (2013.01)

(58) Field of Classification Search
CPC .... G06F 11/1032; G06F 3/0619; G06F 3/064; G06F 3/0673; G11C 29/52; G11C 2029/0411; G11C 7/1006; G11C 7/1051
USPC ................................ 714/764, 768, 773, 799
See application file for complete search history.

(56) References Cited

U.S. PATENT DOCUMENTS

| 9,170,879 | B2* | 10/2015 | Yang | G06F 11/106 |
| 2008/0244356 | A1* | 10/2008 | Bliss | H03M 13/2906 |
| | | | | 714/755 |
| 2009/0094504 | A1* | 4/2009 | Sadakata | G06F 11/1032 |
| | | | | 714/764 |
| 2011/0320909 | A1* | 12/2011 | Fee | G06F 11/1064 |
| | | | | 714/758 |
| 2012/0182821 | A1* | 7/2012 | Perego | G06F 11/1048 |
| | | | | 365/230.03 |
| 2014/0129903 | A1* | 5/2014 | Yoon | G06F 11/1048 |
| | | | | 714/764 |
| 2014/0245105 | A1* | 8/2014 | Chung | G06F 11/1048 |
| | | | | 714/763 |
| 2015/0212879 | A1* | 7/2015 | Choi | G11C 29/52 |
| | | | | 714/766 |
| 2015/0286527 | A1* | 10/2015 | Wu | G11C 11/5642 |
| | | | | 714/773 |
| 2015/0332789 | A1* | 11/2015 | Lee | G11C 29/52 |
| | | | | 714/6.13 |
| 2015/0370634 | A1* | 12/2015 | Huang | G06F 11/1068 |
| | | | | 714/773 |
| 2016/0292032 | A1* | 10/2016 | Von Gemuenden | |
| | | | | G06F 11/1012 |
| 2016/0328285 | A1* | 11/2016 | Healy | G06F 11/1008 |

OTHER PUBLICATIONS

List of IBM Patents or Patent Applications Treated as Related; (Appendix P), Filed May 29, 2015; 2 pages.

Michael B. Healy et al., "Error Vector Readout From a Memory Device", U.S. Appl. No. 14/705,115, filed May 6, 2015.

* cited by examiner

ERROR VECTOR READOUT FROM A MEMORY DEVICE

This application is a continuation of U.S. application Ser. No. 14/705,115 filed May 6, 2015, the disclosure of which is incorporated by reference herein in its entirety.

BACKGROUND

The present invention relates to memory management, and more specifically, to error vector readout from a memory device.

A memory device such as a dynamic random-access memory (DRAM) typically includes error correction capability. Error correction coding (ECC) bits are coded via an encoder onto data that is stored in the DRAM. When the data is read out from the DRAM, a decoder is used to obtain correct data based on the ECC bits. The decoder produces an error vector that is combined with the raw data (in an XOR operation) to obtain the corrected data.

SUMMARY

According to an embodiment, a memory management system includes a controller configured to receive a read command and control a memory device based on the read command; the memory device configured to store raw data and error correction coding (ECC) bits and output the raw data and the ECC bits corresponding with memory addresses specified in the read command; an ECC decoder configured to output an error vector associated with the memory addresses based on the raw data and the ECC bits corresponding with the memory addresses output by the memory device, the error vector associated with the memory addresses indicating errors in the raw data corresponding with the memory addresses; and a multiplexer (MUX) configured to output the error vector based on a selection indicated in the read command.

According to another embodiment, a method of managing output data resulting from a memory device storing raw data and error correction coding (ECC) bits includes receiving a read command, the read command including a specification of one or more memory addresses within the memory device; outputting, from the memory device, the raw data corresponding with the one or more memory addresses and the ECC bits corresponding with the one or more memory addresses; decoding the raw data and the ECC bits corresponding with the one or more memory addresses to output an error vector associated with the one or more memory addresses, the error vector associated with the one or more memory addresses indicating errors in the raw data corresponding with the one or more memory addresses; and outputting the error vector associated with the one or more memory addresses as the output data based on a selection indicated in the read command.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 9 illustrates error vectors for different scenarios according to an embodiment;

FIG. 10 illustrates error vectors for different scenarios according to another embodiment;

DETAILED DESCRIPTION

As noted above, ECC bits encoded on data stored in a memory device (e.g., DRAM) are used to obtain correct data upon readout from the memory device. Any errors in the raw data stored in the memory device are corrected by combining the raw data with decoded ECC bits that are also stored. Specifically, decoding of the ECC bits generates an error vector that is combined (e.g., XOR) with the raw data to provide corrected data. While the corrected data obtained with the error vector is provided, the error vector itself is not currently available. However, the error vector can be used to obtain information that facilitates improved memory management. For example, the error vector, which includes address information, indicates the address locations of errors, facilitates monitoring of errors (e.g., their frequency, concentration in certain memory locations), and the extent of correction that was required to obtain the corrected data. These examples are not exhaustive of the information that can be obtained from the error vector. Previously, a flag pin indicator or other mechanism could be used to indicate an error to the memory controller. However, the memory controller had to stop the read operation and read the internal register of the memory device to determine the memory location of the error. While additional flag pins would prevent the need for the process to determine the memory location, they represent a significant additional resource usage. Embodiments of the systems and methods detailed herein relate to obtaining the error vector without a performance penalty or the need for additional resources. That is, the embodiments discussed below are not a stop-and-check approach like previous approaches and do not require additional pins or other resources.

Figure 1:
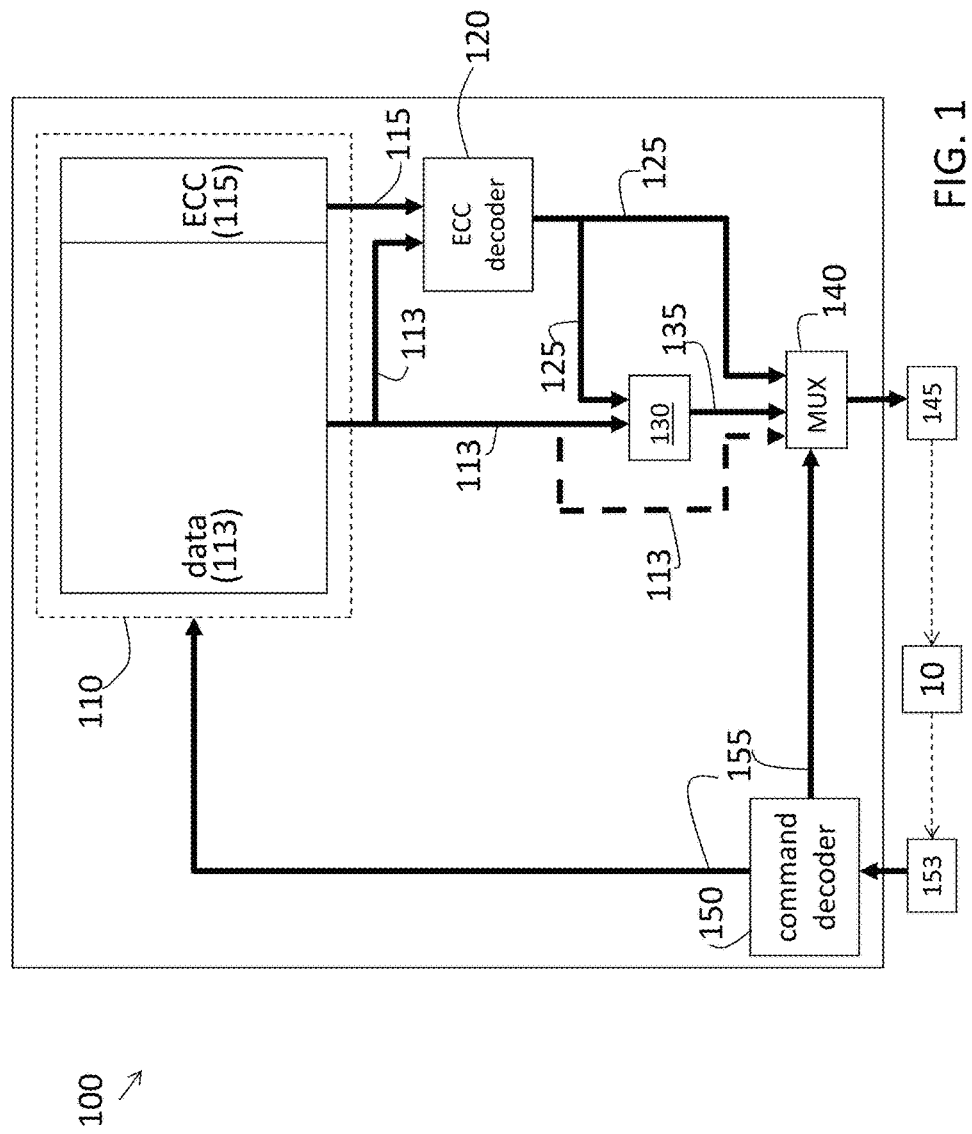
FIG. 1 is a block diagram of a memory management system according to an embodiment of the invention.

FIG. 1 is a block diagram of a memory management system 100 according to an embodiment of the invention. The memory management system 100 may be accessed by a memory controller 10 that accesses any number of memory devices 110. The memory controller 10 includes one or more memory devices storing instructions and one or more processors implementing the instructions. Exemplary processes performed by the memory controller 10 are further discussed below with reference to FIGS. 12-14. A memory device 110 is shown with data 113 and ECC bits 115 stored therein. The data 113 is encoded with ECC bits 115 in the memory device 110. A command 153 input to the command decoder 155 results in a decoded command 155. The command 153 is further discussed below and may come from the memory controller 10. Based on the decoded command 155, data read out from the memory device 110 is initiated. Data readout includes reading out raw data 113 as well as the ECC bits 115. The memory addresses or address range from which corresponding raw data 113 and ECC bits 115 are to be output from the memory device 110 are specified in the read command 153. The ECC decoder 120 uses the data 113 and ECC bits 115 to generate the error vector 125. A component 130 (e.g., exclusive or (XOR) digital logic gate) operates on the raw data 113 and error vector 125 to output the corrected data 135. According to one embodiment, the error vector 125 indicates the location of errors in the raw data 113 which are corrected in the corrected data 135. Other embodiments are discussed further below. The decoded command 155 is also provided to a MUX 140 and is used to output either the corrected data 135 or the error vector 125 as output data 145 according to an embodiment. In alternate embodiments, the MUX 140 output data 145 may be the raw data 113 or may include a compressed version of the error vector 125, as further discussed below. The command 153 may include one or more bits that specify whether the output data 145 should be the error vector 125 (e.g., bit EV=0 when the error vector 125 is not to be output and EV=1 when the error vector 125 is to be output). In the alternate embodiment, the same one or more bits or a different set of bits may be used to specify whether the output data 145 output by the MUX 140 should be the raw data 113. Other embodiments are discussed below that specify other output data 145 options. The output data 145 may be provided to the memory controller 10. Exemplary readouts are discussed below.

Figure 2:
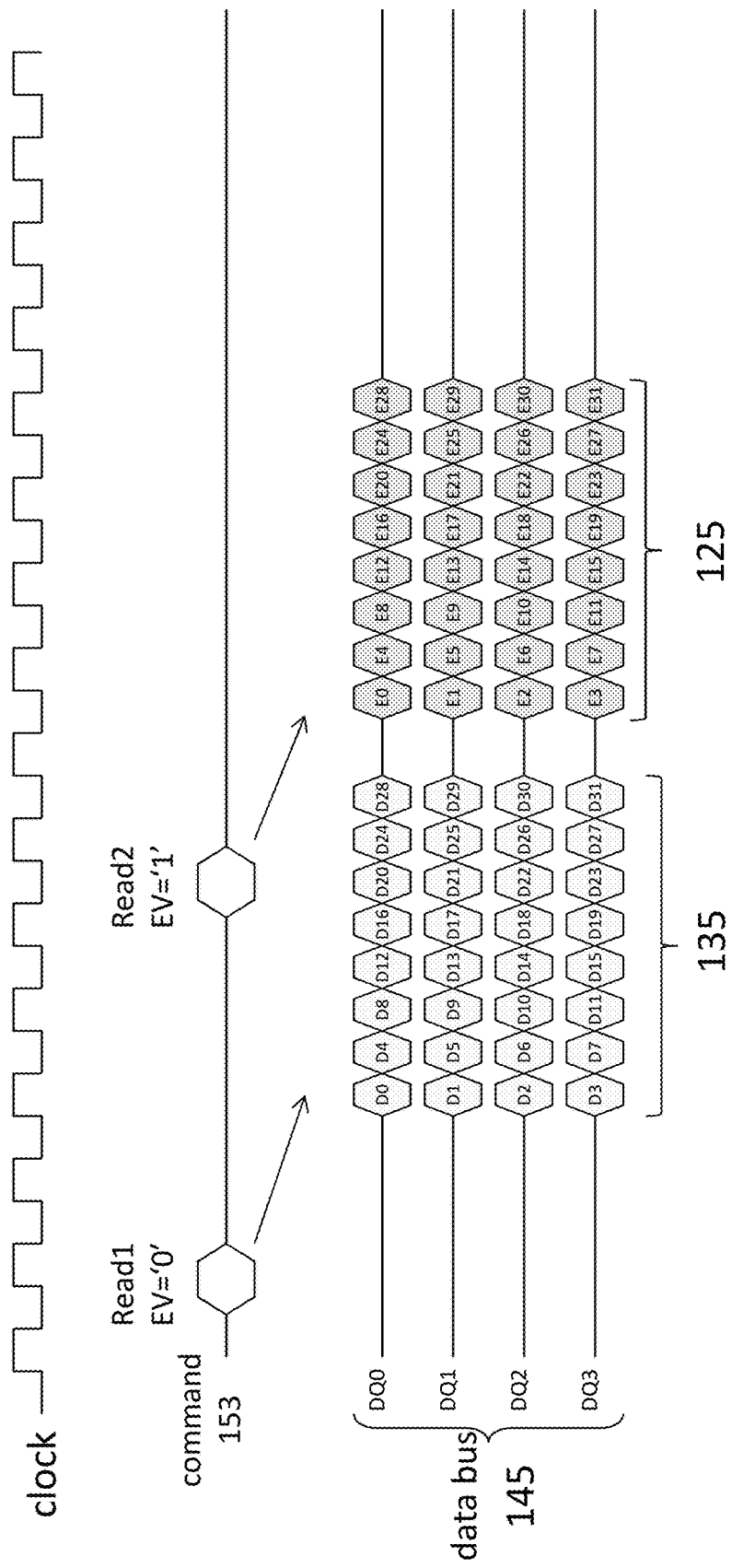
FIG. 2 illustrates the output data resulting from two different commands according to an embodiment.
Figure 3:
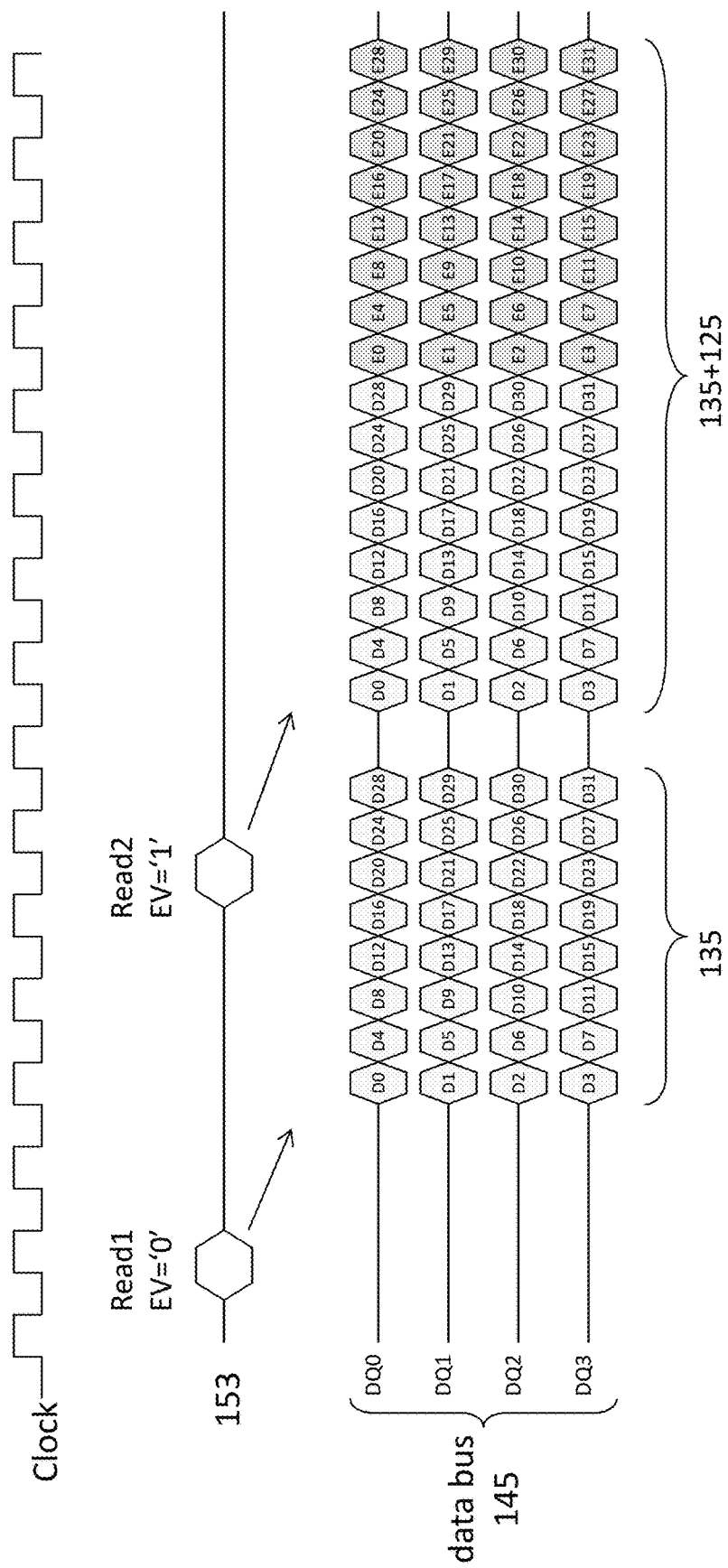
FIG. 3 illustrates the output data resulting from two different commands according to another embodiment.
Figure 4:
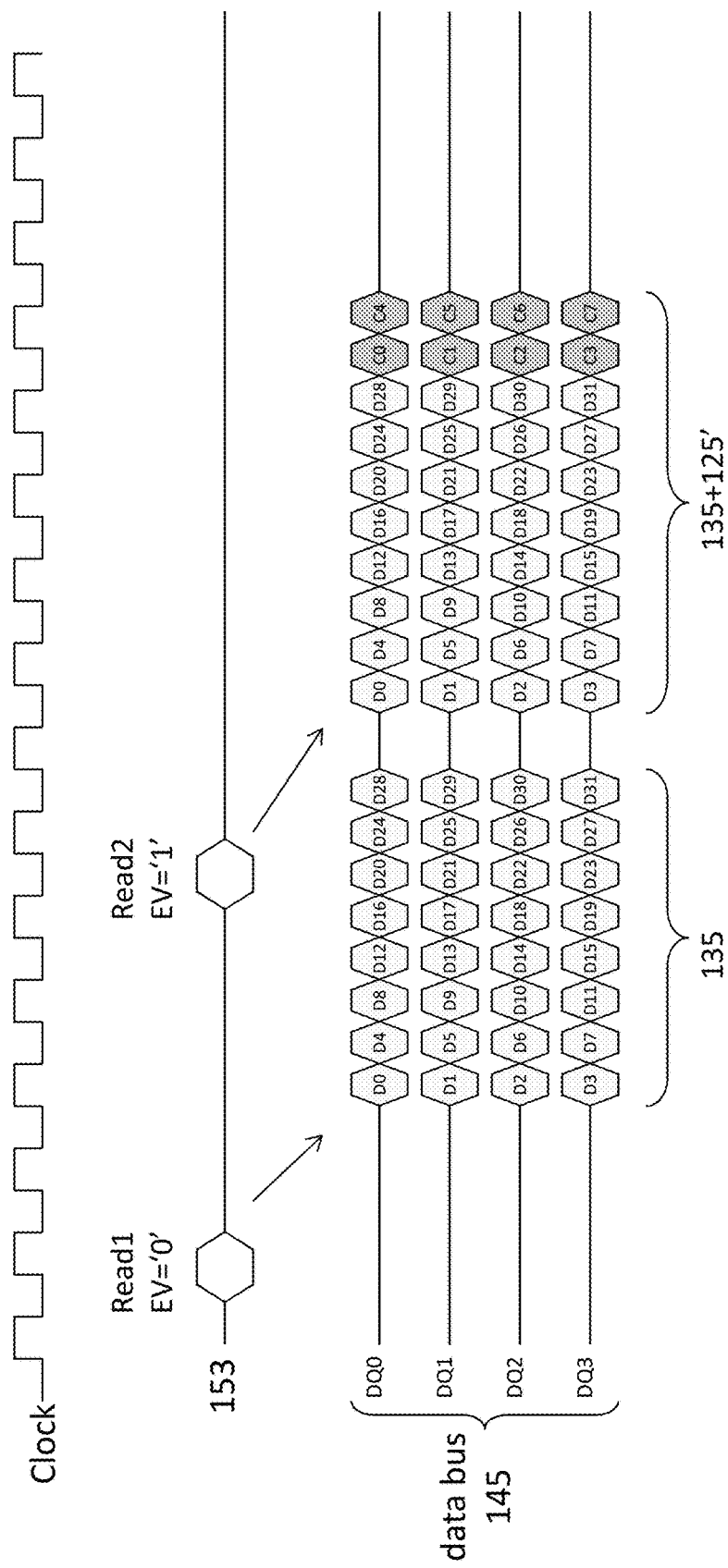
FIG. 4 illustrates the output data resulting from two different commands according to yet another embodiment.

FIGS. 2-4 illustrate exemplary readouts according to three different embodiments. In each embodiment, an input command 153 results in a particular output data 145 from the MUX 140. While the embodiment in which raw data 113 rather than corrected data 135 is output as the output data 145 is not explicitly discussed, raw data 113 may be output rather than corrected data 135 in any of the embodiments shown in FIGS. 2-4 based on the command 153. This may be accomplished by setting a bit (e.g., RV) in the command 153 to indicate that the raw data 113 should be output by the MUX 140 as the output data 145.

FIG. 2 illustrates the output data 145 resulting from two different commands 153 according to an embodiment. The first command 153 (Read1) includes the error vector bit (e.g., EV) set to 0, indicating that the error vector 125 is not to be output. As a result, corrected data 135 (or, alternately, raw data 113) is output, as indicated by the arrow in FIG. 2. The exemplary corrected data 135 is 32 bits in FIG. 2, but the example is not intended to limit the length of the corrected data 135 or the arrangement of the data bus that provides the output data 145. When another command 153 (Read2) is issued with EV set to 1, indicating that the error vector 125 is to be output, the error vector 125 is provided as the output data 145. The command 153 (Read2 with EV=1) may be issued after some specified number of regular read commands 153 (Read1 with EV=0) (e.g., every 100 read commands) or may be issued based on an event or according to another trigger.

FIG. 3 illustrates the output data 145 resulting from two different commands 153 according to another embodiment. The first command 153 (Read1) includes the error vector bit (e.g., EV) set to 0, indicating that the error vector 125 is not to be output. As a result, and similarly to the embodiment shown in FIG. 2, corrected data 135 is output as the output data 145. In alternate embodiments, raw data 113 rather than corrected data 135 may be output as output data 145. When another command 153 (Read2) is issued with EV set to 1, the result is different according to the present embodiment than in the embodiment illustrated in FIG. 2. When EV is set to 1, both the corrected data 135 (or raw data 113) and the error vector 125 are output as the output data 145. As a result, in the exemplary illustrated case in which the data is 32 bits, 64 bits are output as the output data 145 when EV is set to 1. The address range of the corrected data 135 output when EV=0 and when EV=1 may be different (but could be the same) and depends on the address range specified in the command 153. As a comparison of FIGS. 2 and 3 indicates, the embodiment shown in FIG. 3 facilitates reading out the error vector 125 along with readout of data (113 or 135) but requires more time due to the additional bits in the output data 145. In fact, twice as much time is needed in the embodiment shown (for Read2) in FIG. 3 as compared with the embodiment shown in FIG. 2.

Figure 5:
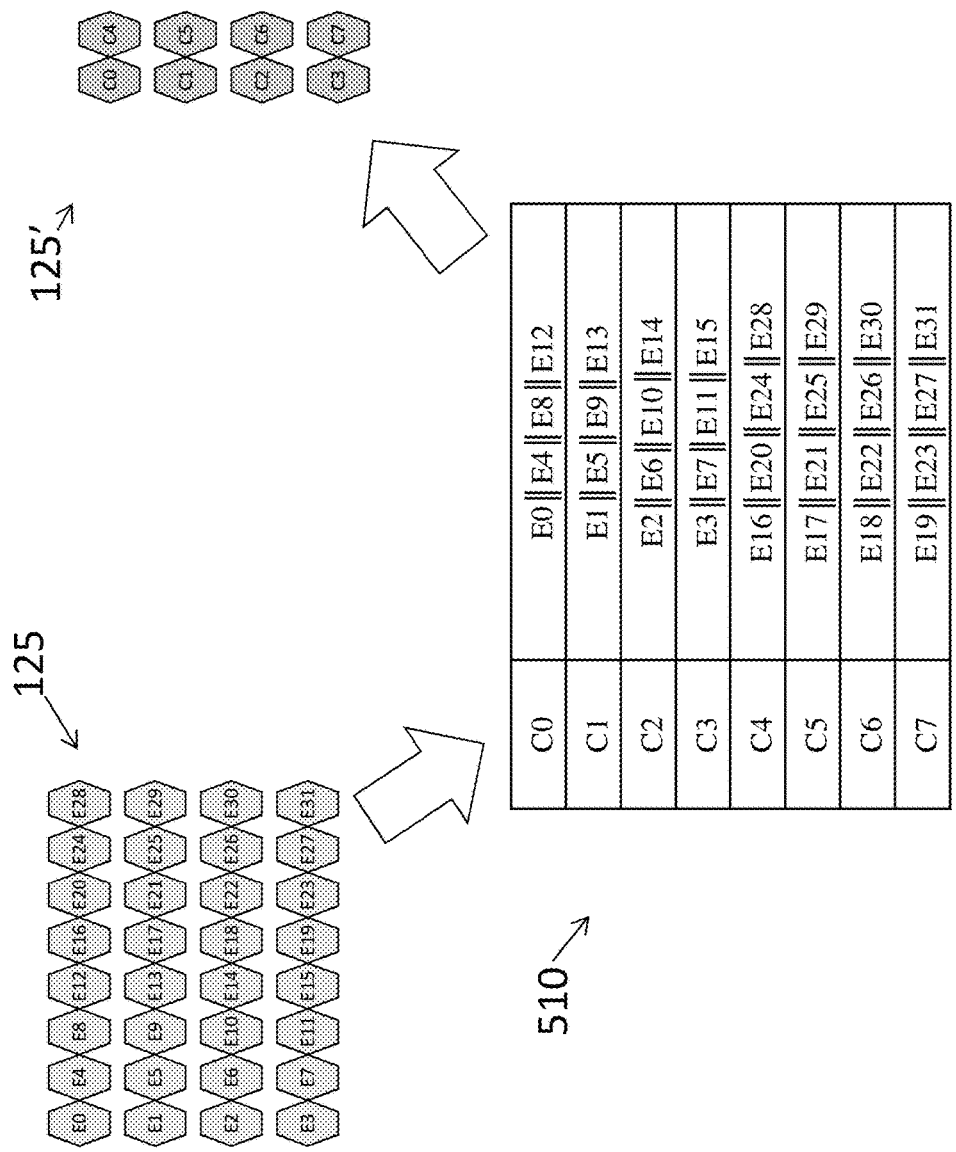
FIG. 5 shows an exemplary compression algorithm for an exemplary error vector according to an embodiment.

FIG. 4 illustrates the output data 145 resulting from two different commands 153 according to yet another embodiment. FIG. 4 shows an embodiment that represents a middle ground between the embodiments shown in FIGS. 2 and 3. Again, for the first command 153 (Read1) with EV set to 0, the output data 145 is the corrected data 135 (or data 113). When another command 153 (Read2) is issued with EV set to 1, the resulting output data 145 includes a compressed error vector 125' along with the corrected data 135. That is, the error vector 125 (8 bits long for each bus line in the example shown in FIG. 3) is compressed (to 2 bits). The compression may be performed according to the exemplary algorithm shown in FIG. 5. This embodiment represents a middle ground between those shown in FIGS. 2 and 3 because information from the error vector 125 is not conveyed in lieu of data (135 or 113), as it is in the embodiment shown in FIG. 2, but less data and, thus, less time, as compared to the embodiment shown in FIG. 3, is required to provide the output data 145 when EV is set to 1. FIG. 5 shows an exemplary compression algorithm for an exemplary error vector according to an embodiment. The table 510 indicates how four bits are compressed to one bit. The symbol || in the table 510 indicates a logical OR operation.

Figure 6:
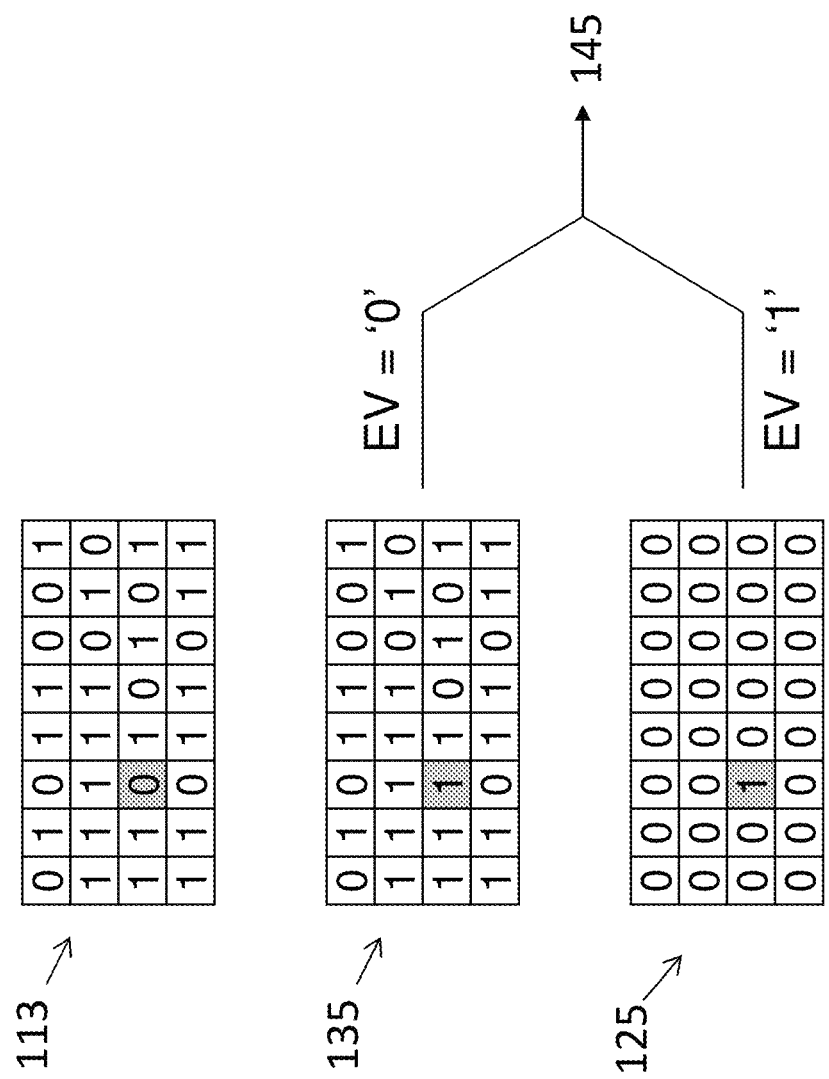
FIG. 6 illustrates exemplary data and error vector bits in the case of correctable error according to embodiments.

FIG. 6 illustrates exemplary data and error vector bits in the case of correctable error according to embodiments. The raw data 113 includes one bit (shaded) that has an error. This bit is corrected in the corrected data 135 and indicated as an error in the corresponding bit of the error vector 125. The output data 145 is the corrected data 135 when the error vector bit (EV) is set to 0. The output data 145 may be one of three different sets of bits when EV is set to 1, according to the embodiments discussed above with reference to FIGS. 2-4. The output data 145 may be the error vector 125 alone (as shown in FIG. 2), the corrected data 135 and the error vector 125 (as shown in FIG. 3), or the corrected data 135 and a compressed version of the error vector 125' (as shown in FIG. 4). The example shown in FIG. 6 includes a correctable error. Exemplary embodiments including patterns to indicate uncorrectable errors are discussed below.

Figure 7:
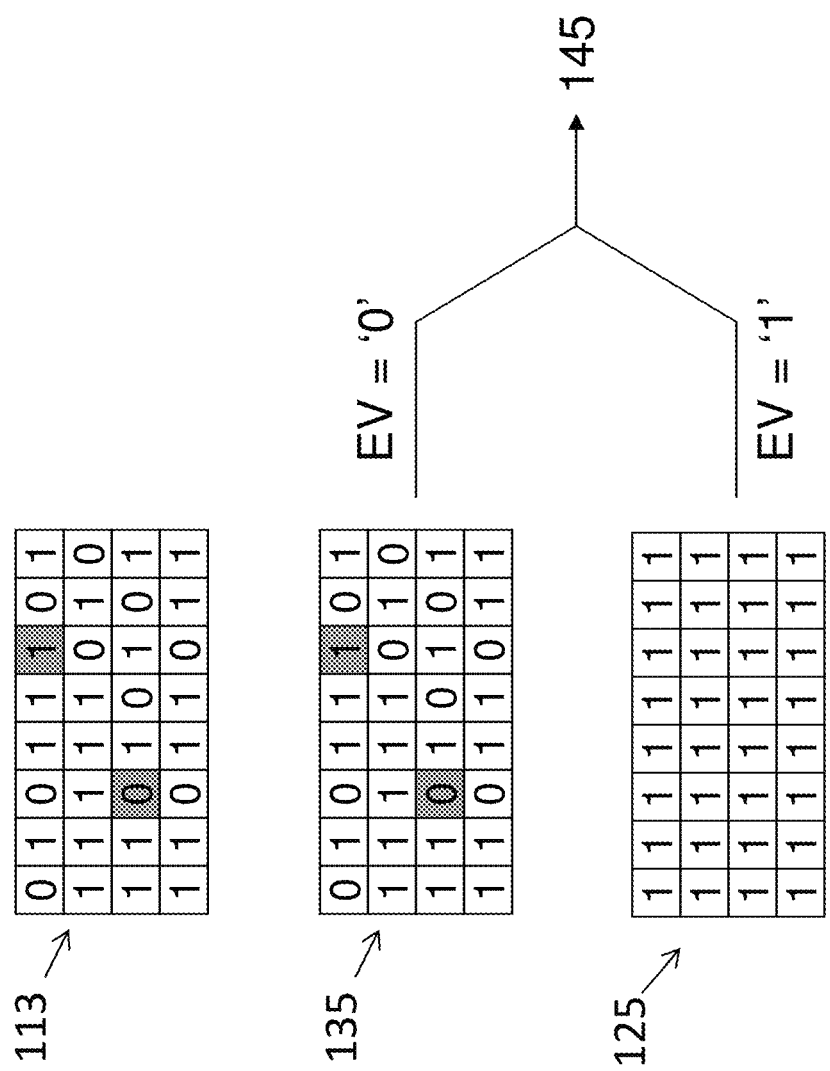
FIG. 7 illustrates exemplary data and error vector bits in the case of uncorrectable error according to embodiments.
Figure 8:
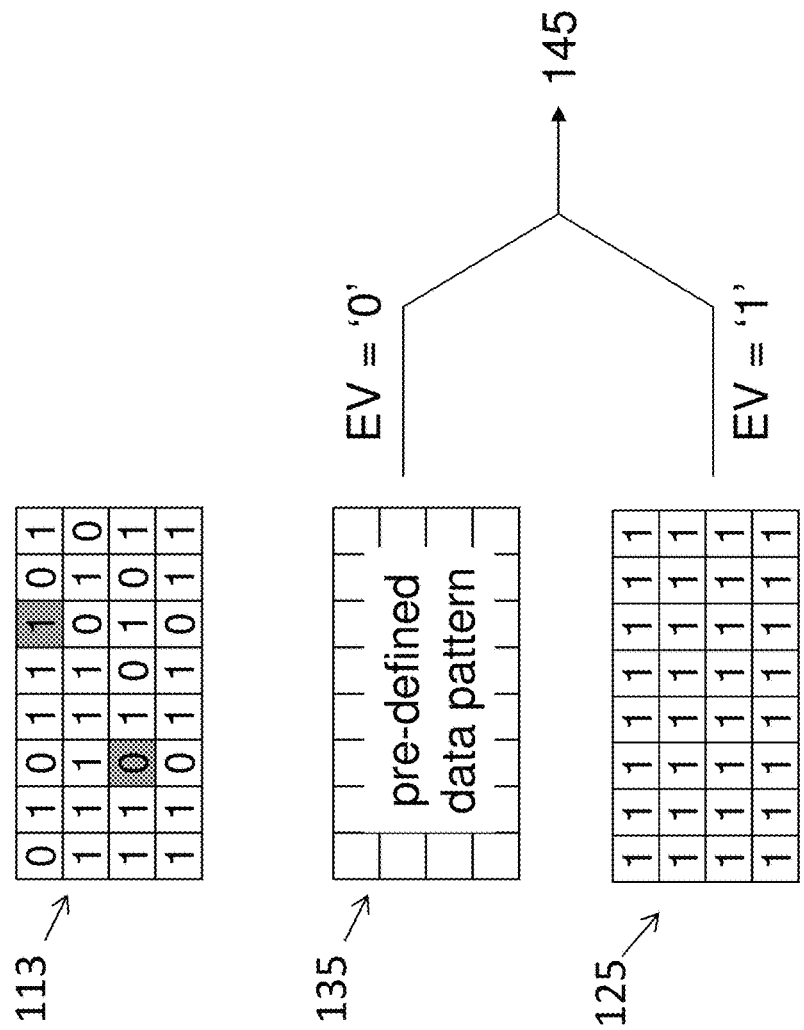
FIG. 8 illustrates exemplary data and error vector bits in the case of uncorrectable error according to another embodiment.

FIG. 7 illustrates exemplary data and error vector bits in the case of uncorrectable error according to one embodiment. The raw data 113 includes two bits (shaded) with errors. The bits with errors may be uncorrectable because information about which bits in particular are in error may not be available through the ECC bits 115, for example. Thus, the errors are detectable but not correctable. According to the present embodiment, in this case, the corrected data 135 is the same as the raw data 113, but the error vector 125 is a predefined pattern (e.g., all '1' in the example) that indicates one or more uncorrectable errors. FIG. 8 illustrates exemplary data and error vector bits in the case of uncorrectable error according to another embodiment. In the embodiment shown in FIG. 8, the corrected data 135 and the error vector 125 are both predefined patterns (and could be the same or different patterns) indicating the presence of uncorrectable data in the raw data 113.

Figure 9:
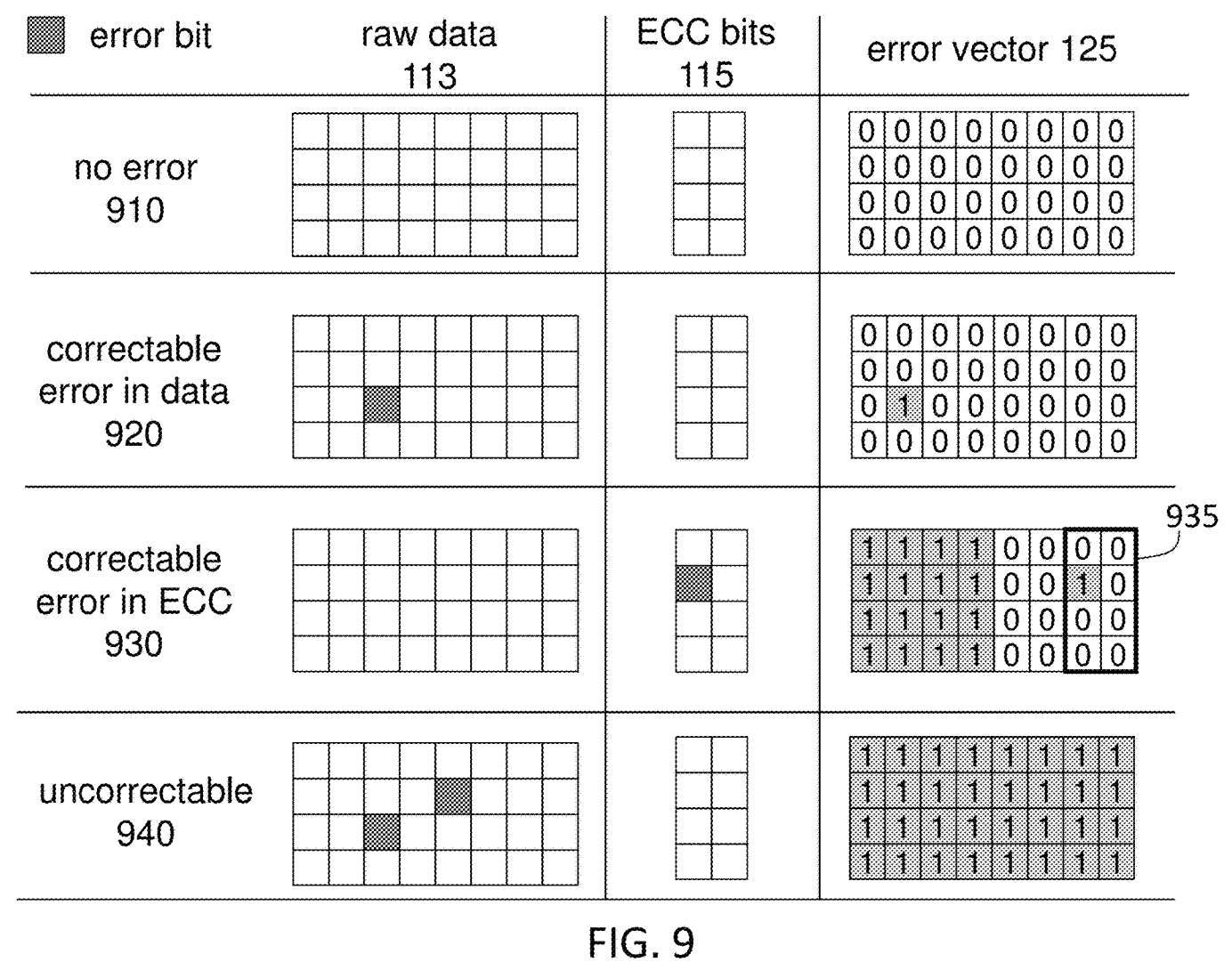

FIG. 9 illustrates error vectors 125 for different scenarios 910-940 according to an embodiment. According to the embodiment illustrated by FIG. 9, the error vector 125 indicates error bits among the ECC bits 115 as well as the raw data 113. In the scenario 910 when there is no error in either the raw data 113 or the ECC bits 115, the error vector 125 is all 0s. For the scenario 920 with a correctable error in the raw data 113 and no error in the ECC bits 115, the corresponding bit is set to 1 (with all other bits set to 0) in the error vector 125. In scenario 930, there are no errors in the raw data 113 but there is an error in one of the ECC bits 115. Noting that the number of bits of the error vector 125 is the same as the number of bits of the raw data 113 such that there are no spare bits to indicate errors in the ECC bits 115, a pattern (shown for the shaded bits) is used to indicate that an error in the ECC bits 115 is shown at bits 935. The bit in the error vector 125 within the bits 935 that corresponds with the erroneous ECC bit 115 is set to 1 while other bits within the bits 935 are set to 0. In scenario 940, an uncorrectable error is detected in the raw data 113. In this case, the error vector 125 is generated in a pattern, similarly to the embodiments shown in FIGS. 7 and 8. Although the scenarios 910-940 are not exhaustive (e.g., combinations of the scenarios 910-940)

Figure 10:
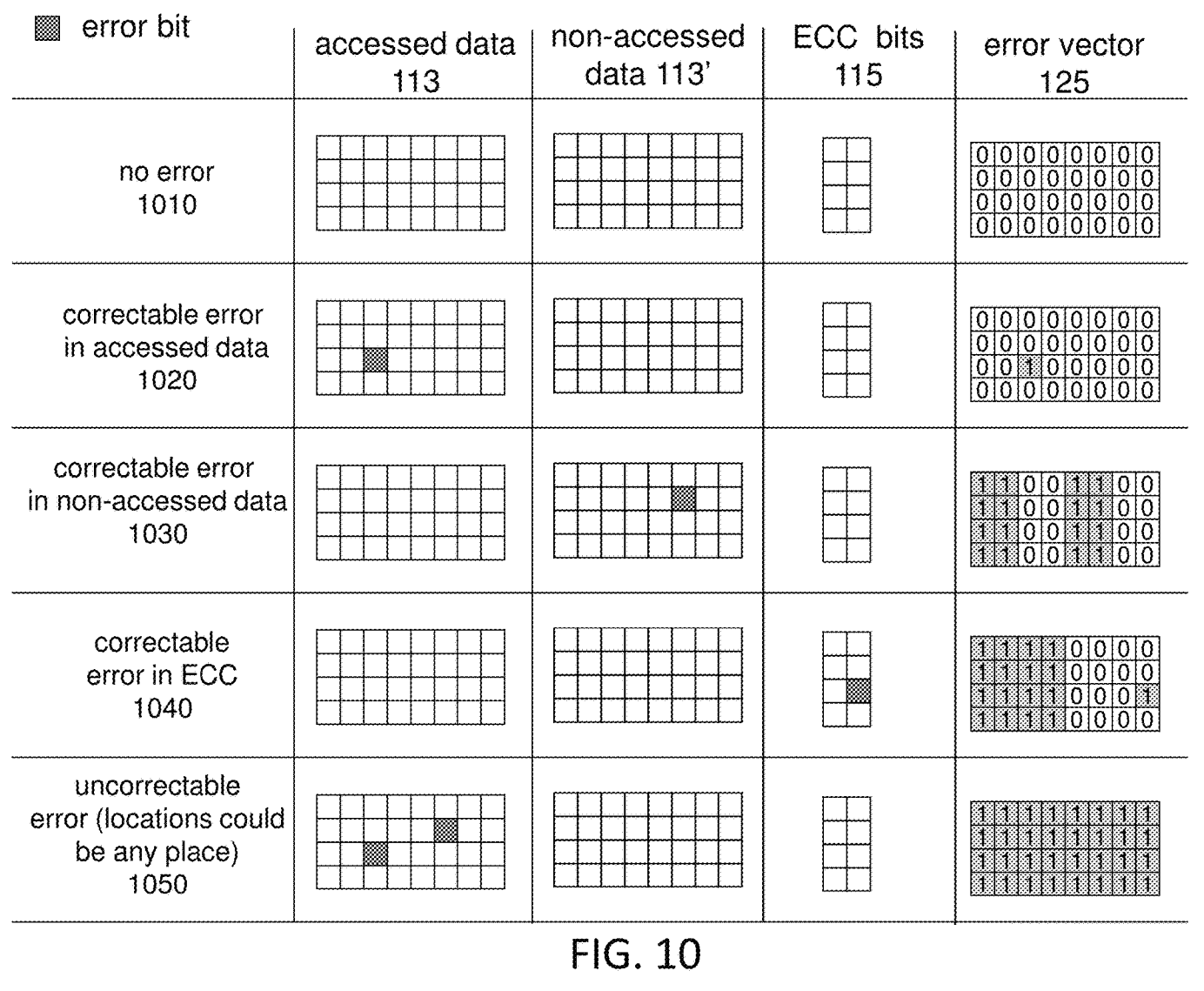

FIG. 10 illustrates error vectors 125 for different scenarios 1010-1050 according to another embodiment. According to the embodiment illustrated by FIG. 10, the error vector 125 indicates errors among not only the accessed raw data 113 and ECC bits 115 but also among non-accessed raw data 113. This embodiment relates to ECC bits 115 that are calculated over accessed data 113 and non-accessed data 113'. The memory device 110 uses the ECC bits 115 and an additional bit to cover twice as much data 113 (e.g., 64 bits rather than just 32 bits). The non-accessed data 113' is stored in the memory device 110 but not read out as the raw data 113 in the examples discussed herein. When there are no errors in the accessed data 113, non-accessed data 113', or ECC bits 115, as in scenario 1010, the error vector 125 includes all 0s. When, as in scenario 1020, there is a correctable error in the accessed data 113, the error bit is indicated in a corresponding bit of the error vector 125. When the non-accessed data 113' includes a correctable error, as in scenario 1030, the error vector 125 is a pattern that indicates that there is an error in one of the two datasets (113, 113') associated with the ECC bits 115. Alternately, the error vector 125 may be all 0s to indicate that the accessed data 113 does not include any errors. In scenario 1040, there is a correctable error in the ECC bits 115. This scenario 1040 results in a pattern, similarly to scenario 930, and also an indication in the error vector 125 of the erroneous bit among the ECC bits 115. When there is an uncorrectable error in the accessed data 113, as in scenario 1050, the error vector 125 is a pattern, similarly to scenario 940.

Figure 11:
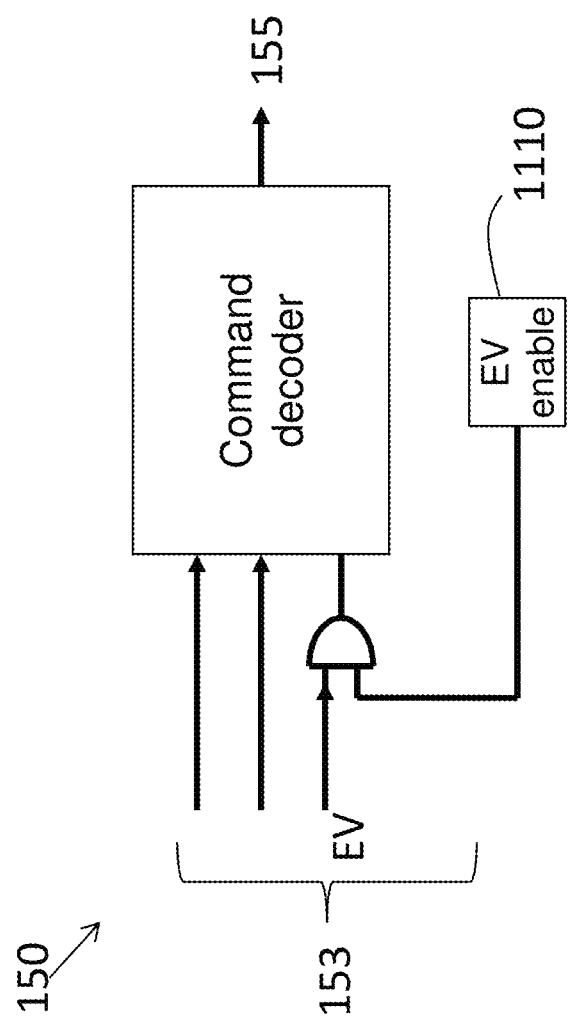
FIG. 11 is an exemplary implementation of the command decoder of the memory management system according to an embodiment.

FIG. 11 is an exemplary implementation of the command decoder 150 of the memory management system 100 according to an embodiment. The different bits set as the command 153 input to the decoder 150 include the EV bit. As FIG. 11 indicates, a mode register 1110 may be used to enable or disable the EV readout bit.

Figure 12:
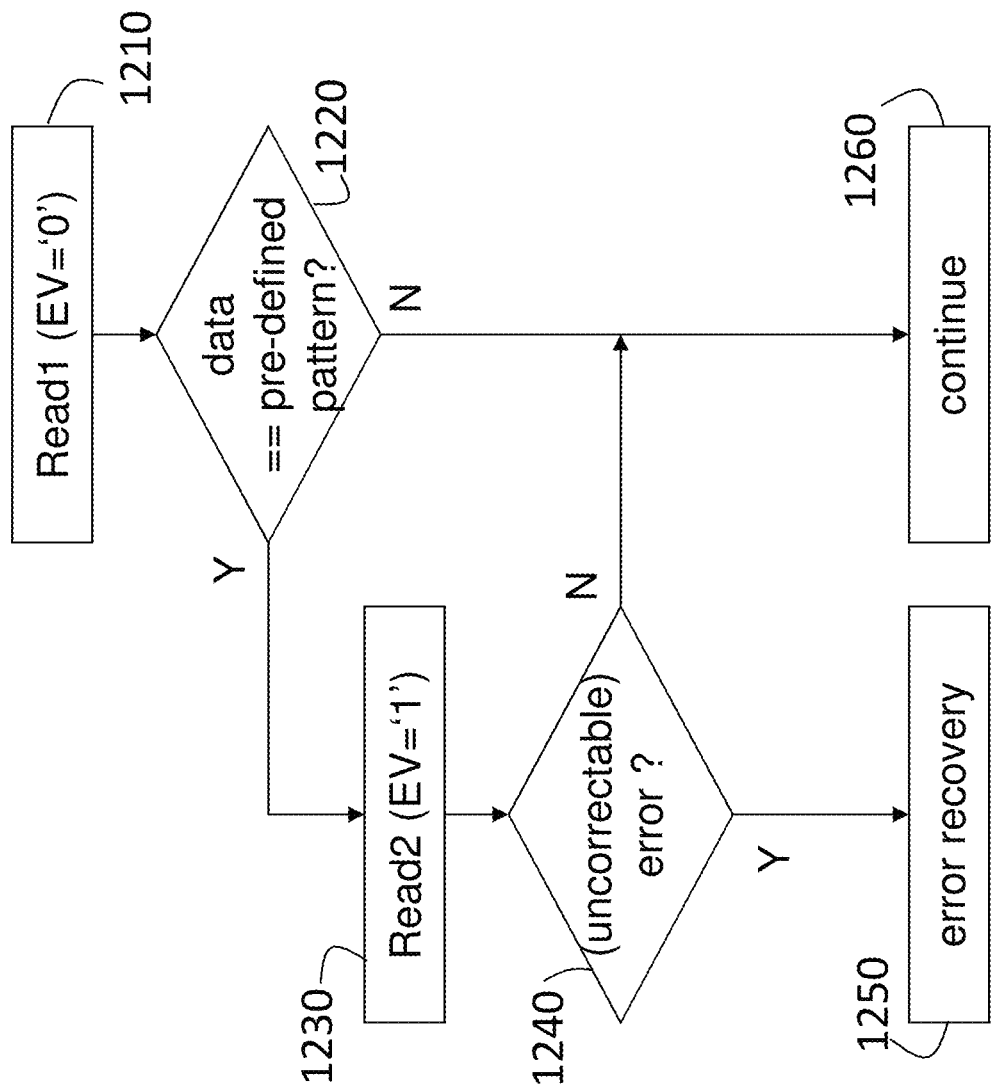
FIG. 12 is a process flow of a method of using the error vector obtained according to embodiments.
Figure 13:
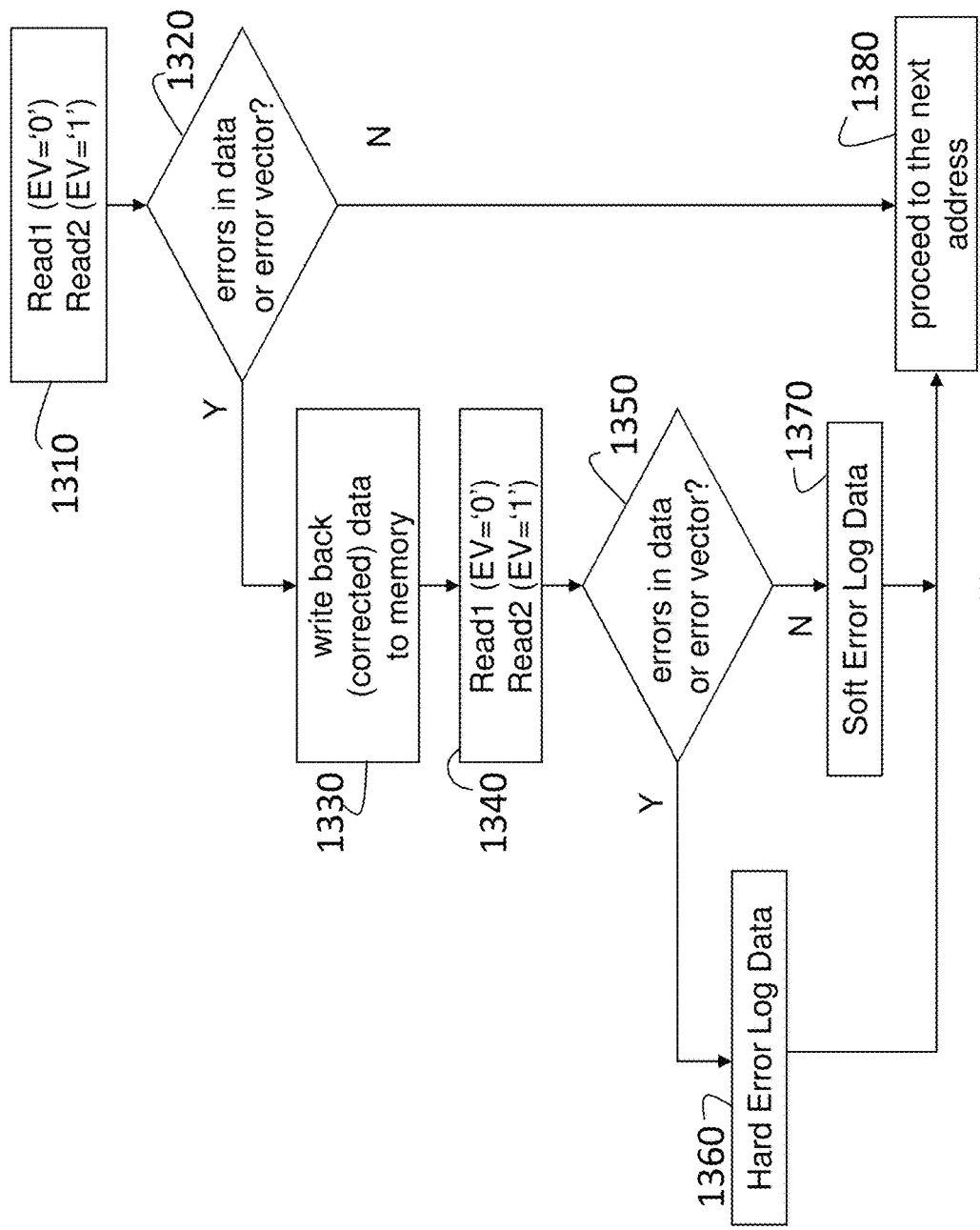
FIG. 13 is a process flow of another method of using the error vector obtained according to embodiments.
Figure 14:
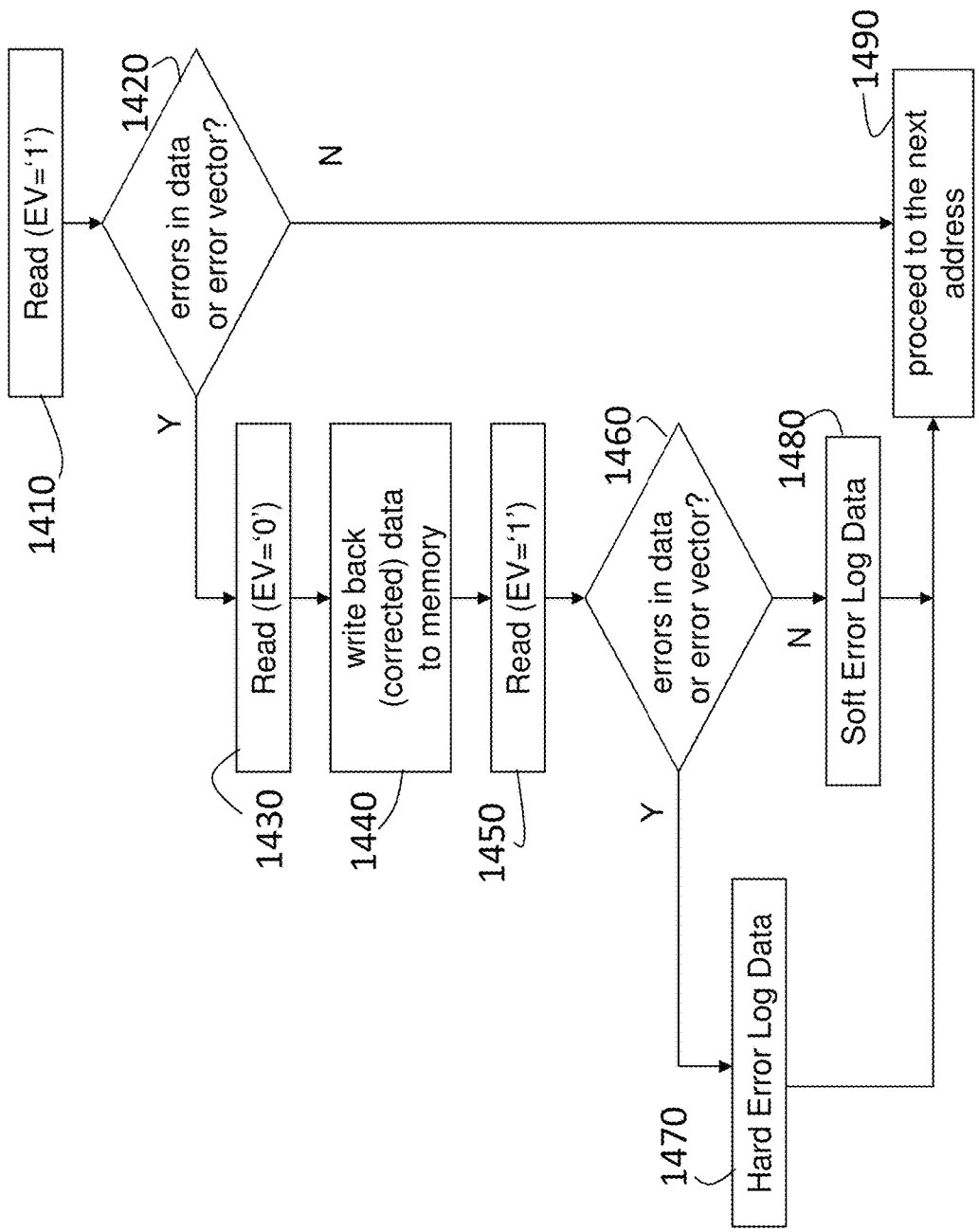
FIG. 14 is a process flow of yet another method of using the error vector obtained according to embodiments.

FIGS. 12-14 illustrate exemplary process flows implemented by the memory controller 10 that uses the memory management system 100. FIG. 12 is a process flow of a method of using the error vector obtained according to embodiments discussed herein. The present embodiment relates to a regular read, for example. At block 1210, a read operation (Read1) is done with EV set to 0, indicating that the error vector 125 should not be output. A determination is then made, at block 1220, whether the corrected data 135 is a pre-defined pattern. As shown in FIG. 8, for example, the corrected data 135 being a pre-defined pattern may indicate an uncorrectable error. When the corrected data 135 is a pre-defined pattern, then at block 1230, another read (Read2) is done with EV set to 1, indicating that the error vector 125 should be output. Based on other bits set in the command 153 according to various embodiments discussed above, this second read may additionally call for raw data 113 or corrected data 135 being output. At block 1240, based on the error vector 125, it is determined if there is an uncorrectable error in the raw data 113. When it is determined that there is an uncorrectable error in the raw data 113, error recovery is pursued at block 1250. The error recovery may be by known techniques. When it is determined that the corrected data 135 is not a pre-defined pattern (at block 1220) or it is determined that there is no uncorrectable error in the raw data 113 (at block 1240), the process of continuing normal operation is continued at block 1260. This process may include reading additional data from the memory device 110 for example.

FIG. 13 is a process flow of another method of using the error vector obtained according to embodiments. The present embodiment relates to a memory scrubbing process, for example, in which memory locations of the memory device 110 are read and corrected as needed. Memory locations in which errors persist after corrected data has been written back are said to have hard errors while memory locations in which errors do not persist are said to have soft errors. At block 1310, a first read (Read1) with EV set to 0, indicating that the error vector 125 should not be output (i.e., only data (113 or 135) should be output), is followed by a second read (Read2) with EV set to 1, indicating that the error vector 125 should be output. At block 1320, it is determined if there are errors in the data (113 or 135) or error vector 125 (e.g., error vector 125 is a pre-defined pattern). When there is an error in the data 113, 135 or error vector 125, correct data is written into the memory location at block 1330. This correction is followed by another set of reads (Read1 and Read2) at block 1340. At block 1350, it is determined if there are errors in the data 113, 135 or error vector 125. When there is (still) an error in the data 113, 135 or error vector 125 at this stage (after the correction at block 1330), the error is logged in the hard error log at block 1360. When there is no error in the data 113, 135 or error vector 125 after the correction at block 1330, a soft error is logged at block 1370. Following the hard or soft error logging (blocks 1360 or 1370) or when it is determined (at block 1320) that there is no error in the data 113, 135 or error vector 125 after the first set of reads (at block 1310), the process continues. Until every memory location of the memory device 110 has been read, continuing includes proceeding to the next address or memory location of the memory device 110.

FIG. 14 is a process flow of yet another method of using the error vector obtained according to embodiments. Like the example discussed with reference to FIG. 13, the embodiment shown in FIG. 14 relates to a memory scrubbing process. At block 1410, a read is done with EV set to 1, indicating that the error vector 125 should be output. As discussed with reference to FIG. 3, for example, the data (113 and/or 135) may additionally be output. At block 1420, it is determined whether there is an error in the data 113, 135 or error vector 125. If there is an error found at block 1420, another read is performed at block 1430 with EV set to 0, indicating that the error vector 125 should not be output. At block 1440, corrected data is written back to the memory location(s) that had an error (determined at block 1420). Then, at block 1450, another read is performed with EV set to 1. At block 1460, it is determined whether there is an error in the data 113, 135 or error vector 125. If there is an error again, then the error is persistent and is logged as a hard error at block 1470. If there is no error after this read (at block 1450), then the error is logged as a soft error at block 1480. Following the hard or soft error logging (blocks 1470 or 1480) or when it is determined (at block 1420) that there is no error in the data 113, 135 or error vector 125 after the first read (at block 1410), the process continues. Until every memory location of the memory device 110 has been read, continuing includes proceeding to the next address or memory location of the memory device 110.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of managing output data resulting from a memory device storing raw data and error correction coding (ECC) bits, the method comprising:
    receiving a read command, the read command including a specification of one or more memory addresses within the memory device;
    outputting, from the memory device, the raw data corresponding with the one or more memory addresses and the ECC bits corresponding with the one or more memory addresses;
    decoding the raw data and the ECC bits corresponding with the one or more memory addresses to output an error vector associated with the one or more memory addresses, the error vector associated with the one or more memory addresses indicating errors in the raw data corresponding with the one or more memory addresses; and
    outputting the error vector associated with the one or more memory addresses as the output data based on a selection indicated in the read command.

2. The method according to claim 1, further comprising operating on the raw data and the ECC bits corresponding with the one or more memory addresses to output corrected data associated with the one or more memory addresses, the corrected data associated with the one or more memory addresses including corrections to correctable errors in the raw data corresponding with the one or more memory addresses.

3. The method according to claim 2, further comprising outputting the corrected data associated with the one or more memory addresses or the raw data corresponding with the one or more memory addresses as the output data in addition to or instead of the error vector associated with the one or more memory addresses, based on the selection indicated in the read command.

4. The method according to claim 2, further comprising outputting the corrected data associated with the one or more memory addresses or the raw data corresponding with the one or more memory addresses in addition to a compressed version of the error vector associated with the one or more memory addresses as the output data, based on the selection indicated in the read command.

5. The method according to claim 1, wherein the outputting the error vector associated with the one or more memory addresses includes outputting a pre-defined uncorrectable error pattern indicating an uncorrectable error in the raw data corresponding with the one or more memory addresses or outputting a pre-defined non-accessed data pattern indicating an error in the raw data that is at different memory addresses than the one or more memory addresses specified in the read command but is associated with the ECC bits corresponding with the one or more memory addresses.

6. The method according to claim 1, further comprising a controller sending the read command to perform regular readouts from the memory device or sending a plurality of the read commands to perform a scrubbing process on the memory device to identify persistent errors and correctable errors.

* * * * *